United States Patent [19]
Payne

[11] Patent Number: 5,923,608
[45] Date of Patent: Jul. 13, 1999

[54] SCALABLE N-PORT MEMORY STRUCTURES

[75] Inventor: Robert L. Payne, San Jose, Calif.

[73] Assignee: VLSI Technology, Inc., San Jose, Calif.

[21] Appl. No.: 08/962,593

[22] Filed: Oct. 31, 1997

[51] Int. Cl.$^6$ .................................................. G11C 7/00
[52] U.S. Cl. .............................. 365/230.05; 365/230.01; 365/233; 365/189.04
[58] Field of Search ................. 365/230.01, 189.01, 365/230.05, 233, 189.04

[56] References Cited

U.S. PATENT DOCUMENTS

| | | | |
|---|---|---|---|
| 4,933,909 | 6/1990 | Cushing et al. | 365/230.05 |
| 5,177,706 | 1/1993 | Shinohara et al. | 365/189.04 |
| 5,204,841 | 4/1993 | Chappell et al. | 365/230.05 |
| 5,303,200 | 4/1994 | Elrod et al. | 365/230.05 |
| 5,434,818 | 7/1995 | Byers et al. | 365/189.04 |
| 5,477,489 | 12/1995 | Wiedmann | 365/189.04 |
| 5,542,067 | 7/1996 | Chappell et al. | 395/494 |
| 5,826,623 | 10/1998 | Dilbeck | 365/230.05 |

FOREIGN PATENT DOCUMENTS 409162900  1/1997  Japan.

*Primary Examiner*—Viet Q. Nguyen
*Attorney, Agent, or Firm*—Burns, Doane, Swecker & Mathis LLP

[57] ABSTRACT

A scalable N-port memory device using as a building block a dual-port memory device core. The dual-port memory has two ports each of which can either serve as a read or a write port. The resulting N-port memory device, besides allowing for design reuse, offers speed, density and cost advantages over conventional N-port memory devices. For example, to realize a 1K word by 128 bit register file memory device having two write ports and either five or six read ports, three dual-port memory device cores are placed in parallel with one another. Each core has separate parallel (dual) read ports. Two write ports are shared in common among all of the cores. The cores are designed to operate at 2X speed, i.e., twice the desired speed of the N-port memory device. A "cycle" at the N-port memory device is composed of two cycles of the underlying 2X speed devices, typically a read cycle followed by a write cycle. During the write cycle, corresponding locations of each of the device cores are written with identical information. The N-port memory device is well suited for design and layout as a memory compiler providing flexibility in specification of the number of ports, the number of words and the word width.

7 Claims, 3 Drawing Sheets

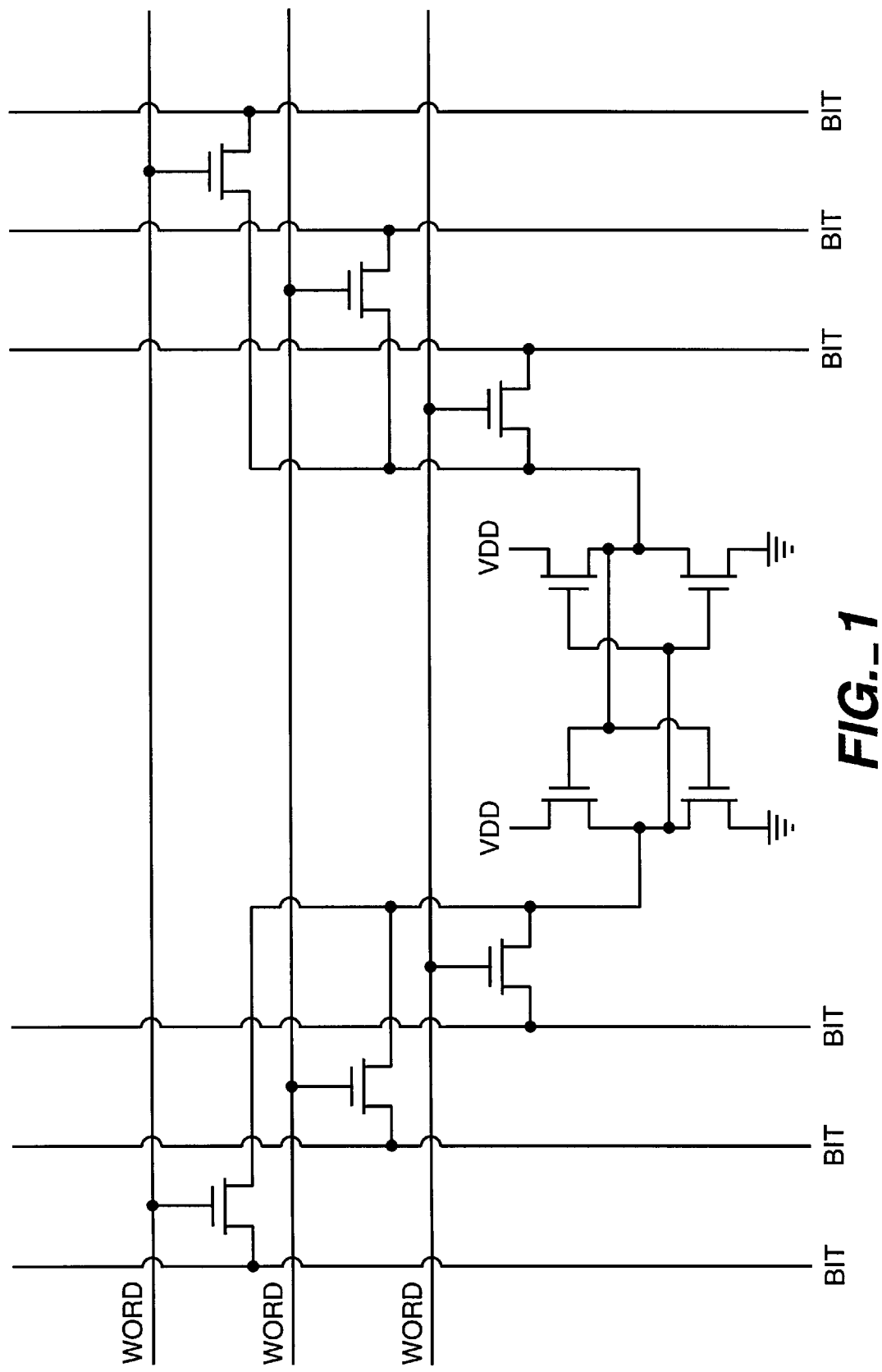
FIG._1

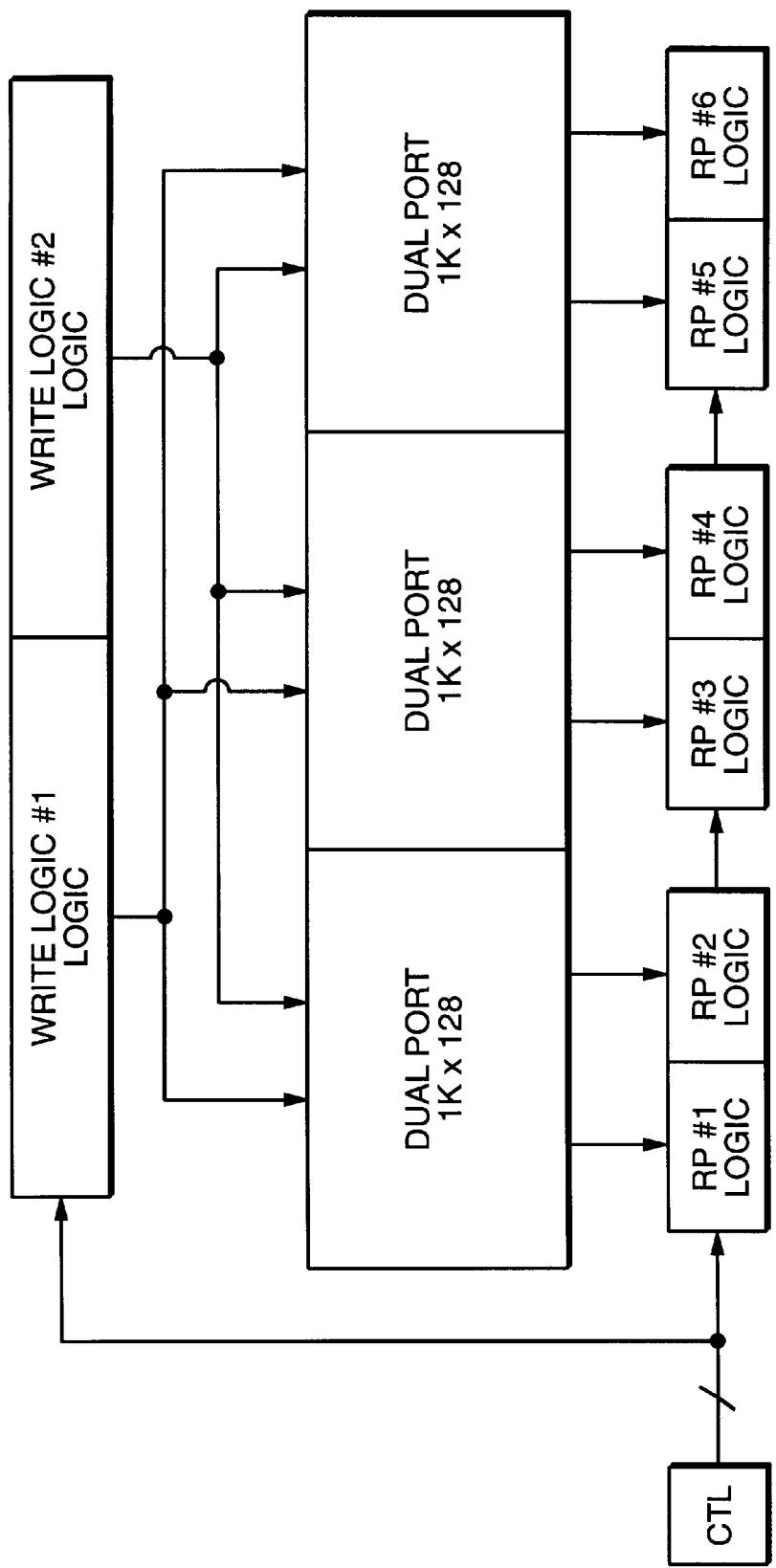
FIG._2

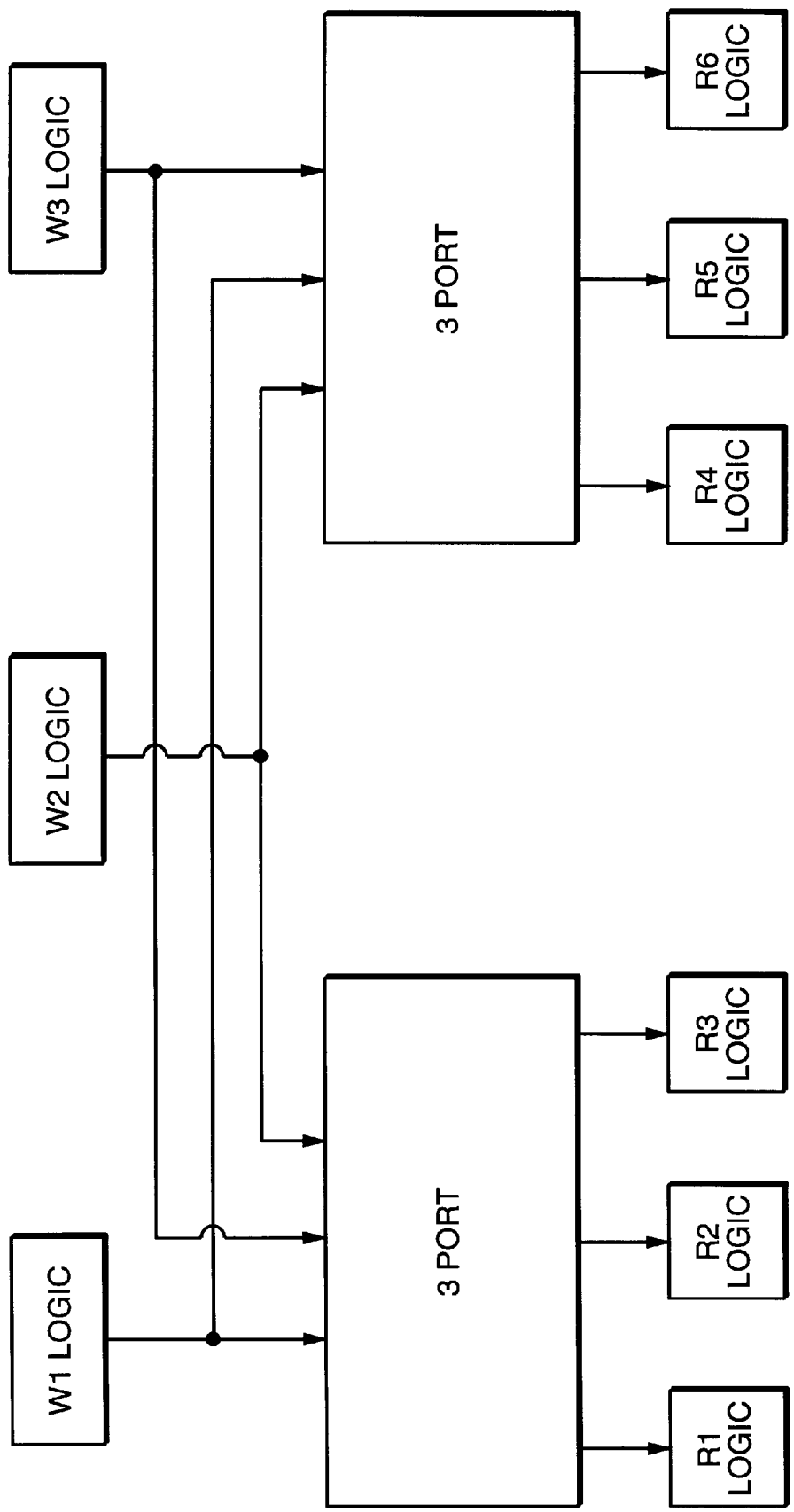
FIG._3

SCALABLE N-PORT MEMORY STRUCTURES

BACKGROUND OF THE INVENTION

1. Field of the Invention

The present invention relates to multi-port memories.

2. State of the Art

Multi-port memory structures are known. Most multi-port memories are dual-port memories. Applications do arise, however, for memory structures having a larger number of ports. Since memory bandwidth increases with the number of ports, memory structures having a large number of ports most commonly occur in high performance computers.

However, as the number of ports increases even modestly, the performance of conventional multi-port memories suffers. Referring to FIG. 1, the conventional way to implement a multi-port memory is to add two additional bit lines and an additional word line, with two N channel transistors for each port. For an N-port memory structure (e.g., an N-port register file), the transistor count would then be $2^N+4$. The layout efficiency drops very rapidly as the number of ports increases. The size of the N channel transistors in the memory latch must also be increased to insure that if multiple ports are simultaneously enabled, the cell will not get flipped (i.e., have its contents inverted). This constraint becomes very difficult to meet if a requirement of the device is that all the read ports can simultaneously access the same word. The cell also slows down as more and more ports are added.

Clearly, a need exists for input memory structures that are more readily scalable.

SUMMARY OF THE INVENTION

The present invention, generally speaking, provides a scalable N-port memory device using as a building block a dual-port memory device core. The dual-port memory has two ports each of which can either serve as a read or a write port. The resulting N-port memory device, besides allowing for design reuse, offers speed, density and cost advantages over conventional N-port memory devices. For example, to realize a 1K word by 128 bit register file memory device having two write ports and either five or six read ports, three dual-port memory device cores are placed in parallel with one another. Each core has separate parallel (dual) read ports. Two write ports are shared in common among all of the cores. The cores are designed to operate at 2X speed, i.e., twice the desired speed of the N-port memory device. A "cycle" at the N-port memory device is composed of two cycles of the underlying 2X speed devices, typically a read cycle followed by a write cycle. During the write cycle, corresponding locations of each of the device cores are written with identical information. The N-port memory device is well suited for design and layout as a memory compiler providing flexibility in specification of the number of ports, the number of words and the word width.

BRIEF DESCRIPTION OF THE DRAWING

The present invention may be further understood from the following description in conjunction with the appended drawing. In the drawing:

FIG. 1 is a schematic diagram of a conventional three port memory cell;

FIG. 2 is a block diagram of an N-port memory structure (two write ports and six read ports as shown) in accordance with the present invention; and FIG. 3 is a block diagram of an N-port memory structure having three write ports.

DETAILED DESCRIPTION OF THE PREFERRED EMBODIMENTS

The present invention is broadly applicable to multi-port memory structures of various descriptions. In an exemplary embodiment, however, the present invention will be described with reference to a register file with two write ports and five read ports. The register file may have a size of 1K words and a word width of 128 bits. The register file may also have a desired operational speed of, for example, 200 MHz. The read port is not allowed to access the same word that is being written in a given cycle (i.e., write through is not supported), but the read ports must be capable of reading the same word. Given the latter simultaneous read requirement, it would be very difficult to achieve the required speed using the conventional approach. Also, using the conventional memory implementation, the size of the register file would be extremely large.

Referring to FIG. 2, in accordance with one embodiment of the invention, the foregoing memory requirements are met using a parallel set of 400 MHz dual-port memories. This realization allows two separate cycles, one read cycle and a separate write cycle, to occur on each port at a rate of 200 MHz.

Referring more particularly to FIG. 2, write port logic for two write ports (write port #1 and write port #2) are provided as common inputs to a number of dual-port memories. The write port logic may be a register or a multiplexer, for example. In any case, each write port logic block is coupled to each of the dual-port memories. Each dual-port memory is provided with read port logic for two read ports (RP#1 and RP#2) in a conventional manner. That is, each read port logic block is dedicated to a particular dual-port memory core, each dual-port memory being coupled to two different read port logic blocks. For simplicity of illustration, the write ports of each of the dual-port memories of FIG. 2 have been illustrated at the top of the dual-port memory block and the read ports have been illustrated at the bottom. It should be understood, however, that each dual-port memory, in actuality, has two ports only, both of which are bidirectional (read/write).

In operation, in the first cycle all of the reads are performed simultaneously. In the second cycle, the write information is simultaneously posted to all three memories. The three dual-port memories will therefore contain identical information. By mapping a cycle of the overall device onto a read cycle followed by a write cycle of the constituent devices, the read information is available very early in the overall device cycle, leaving plenty of set up time to steer the write operation to the memory. Furthermore, for most memories, the write cycle and read cycle are not identical. A special duty cycle controlled timing generator driven by the 200 MHz clock can be implemented to produce an effective 400 MHz clock that steals time from the read cycle to provide extra time for the write cycle (or visa versa, depending on which cycle is the slowest).

In general, to provide a memory device having two write ports and N read ports, the number of parallel dual-port memories will be N–2 rounded up to the nearest integer value.

It is also possible to support memory devices having more than two write ports. To realize a device having three write ports, for example, three write port logic blocks are provided and three-port memories are used. An example of such a memory device is shown in FIG. 3.

The foregoing generality makes the present N-port memory structure well suited for realization using an HDL template-style compiler. The HDL template may call a conventional dual-port compiler. Because of the importance of dual-port memory devices in ASIC design, a dual-port compiler is typically highly optimized. Given all the different possible configurations of N-port memory devices, on the other hand, it would be very difficult to validate a multi-port register file compiler or the like. By using dual-port memories as building blocks, an existing dual-port compiler may be used to advantage to realize N-port memory devices.

The present N-port memory structure offers important benefits in terms of speed, density and cost. In the example described, it is considerably easier to make a 400 MHz dual-port device than it is to make a 200 MHz seven-port device. Furthermore, a device composed of three dual-port memories in parallel is significantly smaller than one conventional seven-port device. The conclusion follows from the recognition that device size does not scale linearly with transistor count. For example, although the transistor count of a dual-port bit cell (eight transistors) is 1.3 times the transistor count of the corresponding single-port bit cell (six transistors), the dual-port bit cell is 1.7 times larger than the single port bit cell. In the foregoing example, the cell size for a seven-port device implemented in the conventional fashion would likely be more than four times larger than the cell size of a dual-port cell.

It will be appreciated by those of ordinary skill in the art that the present invention may be embodied in other specific forms without departing from the spirit or essential character thereof. The foregoing description is considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A memory having N read ports, comprising:

M multi-port memories where $M=[N/2]>2$;

control circuitry for, during one cycle, controlling the M multi-port memories to simultaneously read identical read information from each of the multi-port memories; and for, during another cycle, controlling the M multi-port memories to simultaneously write identical write information to each of the multi-port memories.

2. The apparatus of claim 1 wherein the memory has two write ports and each of said memories is a dual-port memory.

3. The apparatus of claim 2 wherein the control circuitry alternately reads identical information from each of the dual-port memories and writes identical information to each of the dual-port memories.

4. The apparatus of claim 3 wherein each of the dual-port memories operates at a first clock rate that is two times a second clock rate, the second clock rate being the effective clock rate of the memory.

5. The apparatus of claim 4 further comprising a timing generator responsive to a clock signal of second clock rate for generating for each cycle of said clock signal a read cycle and a write cycle.

6. The apparatus of claim 5 wherein the read cycle and the write cycle are of substantially unequal duration.

7. A memory comprising:

a plurality of multi-port memories; and control circuitry for synchronizing contents of each of the plurality of multi-port memories such that the contents of each of the multi-port memories are identical;

whereby the memory may be read from any port of any one of the plurality of multi-port memories.

\* \* \* \* \*